US006958502B2

(12) United States Patent
Lu

(10) Patent No.: US 6,958,502 B2
(45) Date of Patent: Oct. 25, 2005

(54) MAGNETIC RANDOM ACCESS MEMORY CELL

(75) Inventor: Yu Lu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 10/691,300

(22) Filed: Oct. 22, 2003

(65) Prior Publication Data

US 2005/0087785 A1     Apr. 28, 2005

(51) Int. Cl.[7] .............................................. H01L 29/76
(52) U.S. Cl. ...................... 257/295; 365/158; 365/200; 257/295; 257/421
(58) Field of Search ................. 365/158, 200; 257/200, 295, E27.005, E21.665, 421

(56) References Cited

U.S. PATENT DOCUMENTS 6,169,689 B1    1/2001  Naji 6,812,538 B2 *  11/2004  Tsang .......................... 257/421

* cited by examiner

*Primary Examiner*—David Nelms
*Assistant Examiner*—Mai-Huong Tran
(74) *Attorney, Agent, or Firm*—Wan Yee Cheung; Ryan, Mason & Lewis, LLP

(57) ABSTRACT

A memory cell for use in a magnetic random access memory (MRAM) circuit includes at least first and second transistors formed in a semiconductor layer. A first insulating layer is formed on at least a portion of the first and second transistors. The memory cell further includes a first magnetic storage element formed on at least a portion of the first insulating layer, at least a second insulating layer formed on at least a portion of the first magnetic storage element, and at least a second magnetic storage element formed on at least a portion of the second insulating layer. The first and second magnetic storage elements are electrically connected to the first and second transistors, respectively.

23 Claims, 2 Drawing Sheets

MAGNETIC RANDOM ACCESS MEMORY CELL

FIELD OF THE INVENTION

The present invention relates generally to memory devices, and more particularly relates to a magnetic random access memory (MRAM) cell architecture having an increased density.

BACKGROUND OF THE INVENTION

An MRAM cell typically includes a magnetic storage element, for example, a magnetic tunnel junction (MTJ) device, for storing a bit of information represented by two stable states in which the memory cell can reside. While semiconductor process technology, such as, for example, complementary metal-oxide-semiconductor (CMOS) technology, used to fabricate MRAM cells continues to scale aggressively below 0.18 micron ($\mu$m) dimensions, conventional MTJ devices often encounter difficulties due at least in part to a super-paramagnetic effect. The super-paramagnetic effect generally arises from the basic principles of thermal dynamics and is related to the total magnetic moment per bit, the switching field, and the temperature of the MTJ device in storage or operation.

When an energy barrier between the two stable states of the MRAM cell (often defined as the product of the total magnetic moment and the switching field associated with the device) is not much larger than the thermal energy per single degree of freedom kT, where k is Boltzman's constant and T is temperature in degrees Kelvin, the thermal energy could spontaneously switch the state of the memory cell without any external excitation (e.g., magnetic field). This may cause the information stored in the MRAM to randomize over time, thus undesirably affecting the data integrity of the MRAM. The requirement of maintaining an adequately large total magnetic moment for a given MRAM cell in order to avoid spontaneous switching is in direct contradiction with the trend to scale down the size of the MRAM cell and switching field.

There exists a need, therefore, in the field of MRAM for an architecture for implementing a magnetic memory cell which provides increased memory cell density without suffering from the above-noted deficiencies associated with conventional magnetic memory cells.

SUMMARY OF THE INVENTION

The present invention is an improved magnetic memory cell including an n-transistor, n-MTJ (nTnMTJ) architecture providing increased cell density without significantly reducing a lateral size of the MTJ device associated with the memory cell, and therefore without significantly reducing a total magnetic moment of the memory cell. Since the total magnetic moment of the memory cell can be maintained, the cell does not suffer from spontaneous switching which can undesirably affect the data integrity of the memory cell. Moreover, the memory cell architecture of the present invention may be formed using a conventional integrated circuit (IC) fabrication technology, such as, for example, a CMOS process. Consequently, the cost of manufacturing the improved magnetic memory cell is not significantly increased.

In accordance with one aspect of the present invention, a memory cell for use in a magnetic random access memory (MRAM) circuit includes at least first and second transistors formed in a semiconductor layer. A first insulating layer is formed on at least a portion of the first and second transistors. The memory cell further includes a first magnetic storage element formed on at least a portion of the first insulating layer, at least a second insulating layer formed on at least a portion of the first magnetic storage element, and at least a second magnetic storage element formed on at least a portion of the second insulating layer. The first and second magnetic storage elements are electrically connected to the first and second transistors, respectively.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described herein in the context of an illustrative magnetic memory cell which may be used in an MRAM. It should be appreciated, however, that the invention is not limited to this or any particular memory cell architecture. Rather, the invention is more generally applicable to techniques for advantageously increasing a density of the magnetic memory cell without also reducing a lateral size of the magnetic storage element (s) associated with the cell. Since the total magnetic moment of the memory cell is directly related to the lateral size of the corresponding storage element, the total magnetic moment of the memory cell is beneficially maintained. Moreover, although implementations of the present invention are described herein with reference to metal-oxide-semiconductor (MOS) transistors and MTJ devices, it should be appreciated that the invention is not limited to such devices, and that alternative devices, such as, for example, bipolar junction transistor (BJT) devices and other magnetic storage elements (e.g., giant magneto-resistive (GMR) devices), may be similarly employed, with or without modifications to the inventive memory cell architecture, as will be understood by those skilled in the art.

Figure 1:
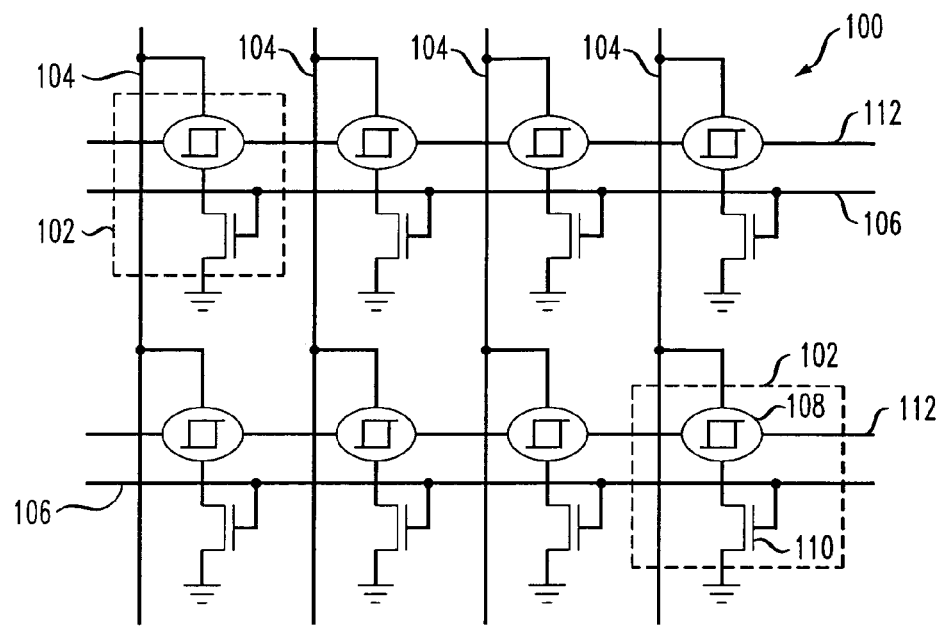
FIG. 1 is a schematic diagram depicting an illustrative MRAM array in which the techniques of the present invention may be implemented.

FIG. 1 is a schematic diagram depicting an illustrative MRAM array 100 in which the techniques of the present invention may be implemented. The MRAM array 100 includes a plurality of memory cells 102 and a plurality of bit lines 104, write word lines 112 and read word lines 106 for selectively accessing one or more of the memory cells. The memory cells 102 are generally arranged at respective intersections of the bit lines 104 and write word lines 112. Each of the memory cells 102 typically includes an MTJ device 108, for storing a logical state of the memory cell, and a transistor 110 connected in series with the MTJ device. Since the memory cells comprise one transistor and one MTJ device, they are often referred to as 1T1MTJ memory cells.

During a read operation, the transistor 110 in a given memory cell 102 functions as a selection device so that only one MTJ device will have any appreciable current flow. During a write operation, the transistor 110 in a given memory cell 102 functions as an isolation device which prevents a write current from passing through the MTJ device 108 and inadvertently changing a designed write current. Transistors associated with memory cells along a given write word line 112 may be coupled to the read word line 106 and enabled in response to a control signal applied to the read word line.

Conventional 1T1MTJ memory cells 102 generally cannot be stacked due, at least in part, to the presence of the transistor 110 in each cell. While it is known to vertically stack two or more cross-point memory cells since the cross-point cell does not possess a transistor, the lack of a transistor in the cross-point cell makes the read operation significantly slower and more complex, and is therefore not preferred in high-speed memory applications. Furthermore, a shorted MTJ device in a cross-point MRAM array would severely reduce yield since the defective memory cell would create a low-resistance electrical connection directly between a corresponding bit line and word line associated with the cell. Consequently, the manufacturing of cross-point MRAM cells is typically more difficult. Furthermore, the lack of an isolation transistor in the cell causes at least a portion of write current to be diverted through the MTJ devices. This current flow through the MTJ devices in a cross-point array often results in a reduced write margin in the MRAM.

Figure 2A:
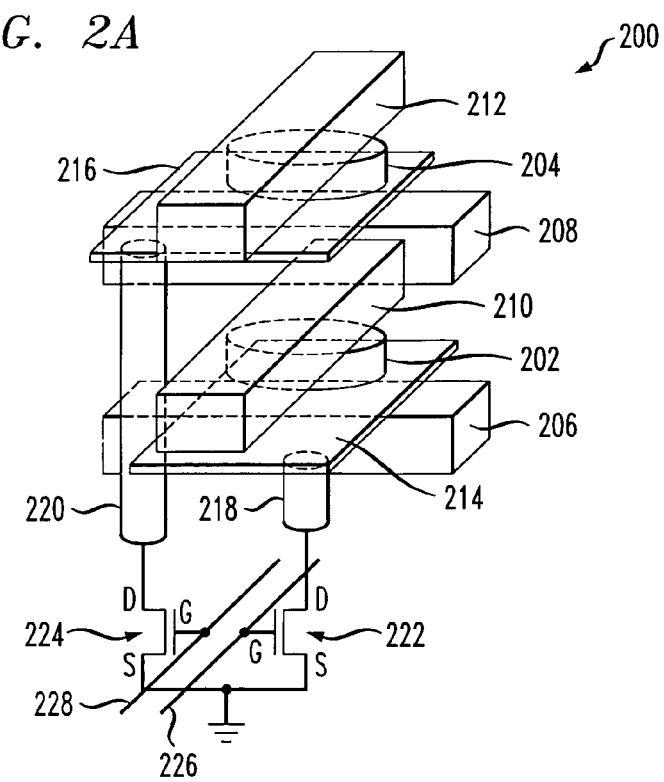
FIG. 2A is a perspective view illustrating an exemplary 2T2MTJ memory cell, formed in accordance with one embodiment of the present invention.

FIG. 2A is a three-dimensional view depicting an illustrative semiconductor layout of an exemplary 2T2MTJ memory cell 200, formed in accordance with one embodiment of the invention. The exemplary memory cell 200 includes a first magnetic storage element 202, which may comprise an MTJ device, and a second magnetic storage element 204, which may also comprise an MTJ device, each magnetic storage device occupying a different level in the cell. While the second magnetic storage element 204 is shown as being stacked vertically above at least a portion of the first magnetic storage element, the two magnetic storage elements need not be overlapping relative to one another.

The memory cell 200 further includes a first transistor 222 and a second transistor 224 for selectively accessing the first and second magnetic storage elements 202, 204, respectively. Each of the transistors 222, 224 is preferably activated (i.e., turned on) in response to a control signal applied to a corresponding read word line 226 and 228 connected to the transistors 222, 224, respectively. It is to be appreciated that although the memory cell is shown having only two stacked magnetic storage elements, the present invention contemplates that the techniques described herein may be readily extended to form an nTnMTJ structure including n layers of stacked MTJ devices and n corresponding transistors, where n is an integer greater than or equal to two. In this manner, further beneficial increases in the density of the memory cells may be obtained without reducing the lateral dimensions of the corresponding magnetic storage elements associated therewith. It is also to be appreciated that although a source region (S) of the transistors 222 and 224 are shown to be connected to a negative voltage supply, which may be ground, the cell structure of the present invention is similarly applicable to other connection arrangements.

Preferably, the sizes of the two MTJ devices 202, 204 are substantially the same, although the present invention contemplates that the two MTJ devices need not be the same size. Furthermore, the two MTJ devices 202, 204 may be stacked so as to be substantially aligned relative to one another along a vertical dimension, although alternative stacking configurations are similarly contemplated, as will be known by those skilled in the art. For example, the stacked MTJ devices 202, 204 may be vertically offset in relation to one another so that electrical connections to the MTJ devices can be optimally placed.

The exemplary memory cell 200 is arranged such that connections, for example, first bit line 210, second bit line 212, first write word line 206 and second write word line 208, for selectively accessing one or more of the MTJ devices 202, 204 in the memory cell, pass through the cell without interfering with local wiring and without inadvertently writing the logical state of an unselected MTJ device. First bit line 210 is electrically connected to the first MTJ device 202 and second bit line 212 is electrically connected to the second MTJ device 204. The write word lines are preferably routed through the memory cell 200 so that a given write word line 206, 208 is in close relative proximity to a corresponding MTJ device 202, 204, respectively, while being substantially isolated from an MTJ device not corresponding to the write word line. In this manner, a magnetic field emanating from a given write word line, which is generated by a current flowing through the write word line, will write the logical state of a selected MTJ device corresponding thereto without also inadvertently writing the logical state of an unselected MTJ device. In a preferred embodiment of the invention, each of bit lines 210, 212 and write word lines 206, 208 are formed in a separate level of the semiconductor device. The present invention contemplates that alternative arrangements of the bit lines and word lines may similarly be employed.

As previously stated, conventional 1T1MTJ memory cells generally cannot be stacked due, at least in part, to the presence of the selection transistor in each cell. Consequently, an important aspect of the present invention is that the MTJ devices and respective electrical interconnections to the MTJ devices are stacked, but the transistors corresponding to the MTJ devices are preferably tiled on the silicon area (not shown) below the MTJ devices. Electrical connection between the transistors 222, 224 and the corresponding MTJ devices 202, 204 formed above the transistors are preferably made by conductive vias, namely, a first via 218 and a second via 220, respectively, formed in the memory cell 200, or by an alternative connection arrangement. A first local interconnect 214 is used to provide an electrical connection between the first via 218 and the corresponding MTJ device 202. Likewise, a second local interconnect 216 preferably provides an electrical connection between the second via 220 and the second MTJ device 204.

Figure 2B:
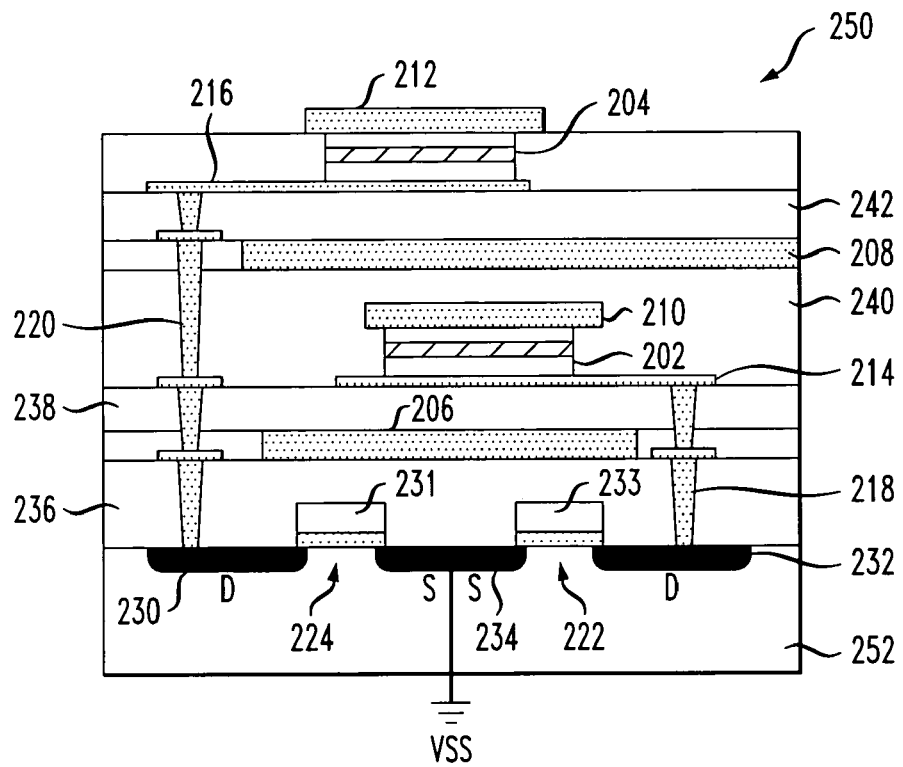
FIG. 2B is a cross-sectional view of at least a portion of a semiconductor wafer in which the exemplary 2T2MTJ memory cell depicted in FIG. 2A is formed, in accordance with the present invention.

FIG. 2B illustrates a cross-sectional view of at least a portion of a semiconductor wafer 250 in which the techniques of the present invention are implemented. It is to be understood that the various regions and/or layers shown in the accompanying figures may not be drawn to scale. Furthermore, certain semiconductor layers of a type commonly used in such integrated circuit structures may have been omitted for ease of explanation. The wafer 250 includes the exemplary 2T2MTJ memory cell 200, shown in FIG. 2A, formed on a substrate 252. The substrate 252 is commonly formed of single-crystal silicon, although alternative materials may be used, such as, but not limited to, germanium (Ge), gallium arsenide (GaAs), etc. Additionally, the substrate 252 may have been modified by adding an impurity or dopant, such as by a diffusion or implant step, to change the conductivity of the material (e.g., n-type or p-type). In a preferred embodiment of the invention, the substrate 252 is of p-type conductivity.

The term "semiconductor layer" as may be used herein refers to any semiconductor material upon which and/or in which other materials may be formed. The semiconductor layer may comprise a single layer, such as, for example, the substrate 252, or it may comprise multiple layers, such as, for example, the substrate 252 and an epitaxial layer (not shown). The semiconductor wafer 250 comprises the substrate 252, with or without the epitaxial layer, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on or in which a circuit element may be formed.

As apparent from the figure, the transistors 222, 224 are formed in the silicon substrate 252, while the corresponding MTJ devices 202, 204, respectively, are formed substantially above the transistors, for example, in an oxide region of the wafer 250. Each of the transistors 224 and 222 preferably comprises a gate 231 and 233, respectively, a drain (D) region 230 and 232, respectively, and a source (S) region 234, which is preferably shared by both transistors. The source region 234 is preferably electrically connected to a negative voltage supply, which may be VSS. The drain and source regions are formed in the wafer, such as by an implant or diffusion process. The drain and source regions are preferably doped, such as by an implant process, with an impurity (e.g., boron, phosphorus, arsenic, etc.) of a known concentration level to selectively change a conductivity of the material as desired. Preferably, the source and drain regions have a conductivity type associated therewith which is opposite the conductivity type of the substrate 252, so that active regions can be formed in the device. In a preferred embodiment of the invention, the source and drain regions 234, 232, 230 are of n-type conductivity.

It is to be appreciated that, in the case of a simple MOS device, because the MOS device is symmetrical in nature, and thus bi-directional, the assignment of source and drain designations in the MOS device is essentially arbitrary. Therefore, the source and drain regions may be referred generally as first and second source/drain regions, respectively, where the term "source/drain" in this context denotes a source region or a drain region.

In the exemplary 2T2MTJ memory cell, the first MTJ device 202 may be formed between first bit line 210 and first local interconnect 214. A first end of local interconnect 214 is coupled to the first MTJ device 202 and a second end of local interconnect 214 is coupled to the drain region 232 of corresponding transistor 222 by way of conductive via 218. A first write word line 206 passes underneath the first local interconnect 214, in close relative proximity to the first MTJ device 202. Likewise, the second MTJ device 204 may be formed substantially above the first MTJ device 202, between second bit line 212 and second local interconnect 216. A first end of local interconnect 216 is coupled to the second MTJ device 204 and a second end of local interconnect 216 is coupled to the drain region 230 of corresponding transistor 224 by way of conductive via 220. Second write word line 208 passes below the second local interconnect 216, in close relative proximity to the second MTJ device 204. The conductive vias 218, 220 are preferably formed in the memory cell by using, for example, a conventional photolithographic patterning and etching process to form openings through one or more insulating layers, followed by a deposition process for filling the openings with an electrically conductive material (e.g., aluminum, gold, etc.). Alternative techniques for forming the conductive vias 218, 220 are similarly contemplated by the invention.

The wafer 250 preferably comprises a plurality of insulating layers, such as, for example, first insulating layer 236, second insulating layer 238, third insulating layer 240 and fourth insulating layer 242. A final insulating layer (not shown), which may be referred to herein as a passivation layer, may also be formed on an upper surface of the wafer 250 for protecting the wafer and providing additional structural support, among other benefits. The insulating layers may be used to electrically isolate the various MTJ devices and corresponding connections so that MTJ devices can be stacked on top of one another without being electrically shorted together. One or more of the insulating layers 236, 238, 240, 242 may comprise an oxide, such as, for example, silicon dioxide ($SiO_2$), although alternative insulating materials may be similarly employed, as will be known to those skilled in the art.

By way of example, first insulating layer 236 is preferably formed substantially over the transistors 222, 224. First write word line 206 is then formed on the first insulating layer 236, thereby being electrically isolated from the transistors. Second insulating layer 238 is formed over at least a portion of the first write word line 206 for electrically isolating the first local interconnect 214, which is preferably formed on the second insulating layer, from the first write word line. Third insulating layer 240 is preferably formed substantially over the first MTJ device 202 for electrically isolating the first MTJ device 202 from the second write word line 208, which is formed on at least a portion of the third insulating layer 240. Fourth insulating layer 242 is formed over at least a portion of the second write word line 208 for electrically isolating the second write word line 208 from the second local interconnect 216, which is preferably formed on at least a portion of the fourth insulating layer 242. It is to be understood that additional insulating layers may be similarly used for stacking additional MTJ devices in the memory cell.

The conductive vias 218, 220 and the local interconnects 214, 216, which may be used to connect the MTJ devices to a corresponding transistor, preferably comprise a metal, such as, for example, aluminum, gold, etc. Likewise, the bit lines 210, 212 and write word lines 206, 208 passing through the memory cell are preferably comprised of a metal, such as, for example, aluminum, gold, etc. Each of the MTJ devices in a given memory cell are preferably formed in different semiconductor levels and separated by one or more insulating layers for providing electrical isolation between the MTJ devices, as previously described. However, one or more of the write word lines associated with the MTJ devices in a given memory cell may be shared between MTJ devices, in accordance with another aspect of the invention. Furthermore, one or more of the bit lines connected to the MTJ devices in a given memory cell may be shared between MTJ devices, in accordance with yet another aspect of the invention. These two aspects of the present invention, however, are mutually exclusive for any two adjacent MTJ devices. To share the write word lines or the bit lines, one of the two tunnel junction levels (e.g., pinned or free magnetic layer) associated with the MTJ devices is preferably formed having an inverted structure compared to the other MTJ device, as will be understood by those skilled in the art. Furthermore, to share the bit lines between adjacent MTJ devices, the present invention may require one or both of the following conditions to be met: (i) the read word lines coupled to the corresponding transistors are not shared; and (ii) both the drain and source regions of the corresponding transistors are not shared.

The first and second write word lines 206, 208 passing through the memory cell are preferably arranged such that a current passing through one of the write word lines does not inadvertently change the logical state of an unselected one of the MTJ devices. Consequently, the first write word line 206 is preferably configured so as to be significantly closer to the first MTJ device 202 than to the second MTJ device 204. Similarly, the second write word line 208 is preferably configured so as to be significantly closer to the second MTJ device 204 than to the first MTJ device 202.

During a read operation, the transistor corresponding to an MTJ device to be read is activated (i.e., turned on). By way of example only, when reading the logical state of MTJ device 202, the corresponding transistor 222 is activated. When transistor 222 is turned on, current sourced along a corresponding bit line 210 passes through MTJ device 202 to the negative voltage supply, and the logical state of MTJ device 202 is read out, as will be understood by those skilled in the art. Likewise, when reading the logical state of MTJ device 204, the corresponding transistor 224 is activated. When transistor 224 is turned on, current sourced along a corresponding bit line 212 passes through MTJ device 204 to the negative voltage supply, and the logical state of MTJ device 204 is read out. The present invention further contemplates that the reading of the MTJ devices 202 and 204 in the exemplary memory cell 200 may also occur simultaneously.

Figure 3:
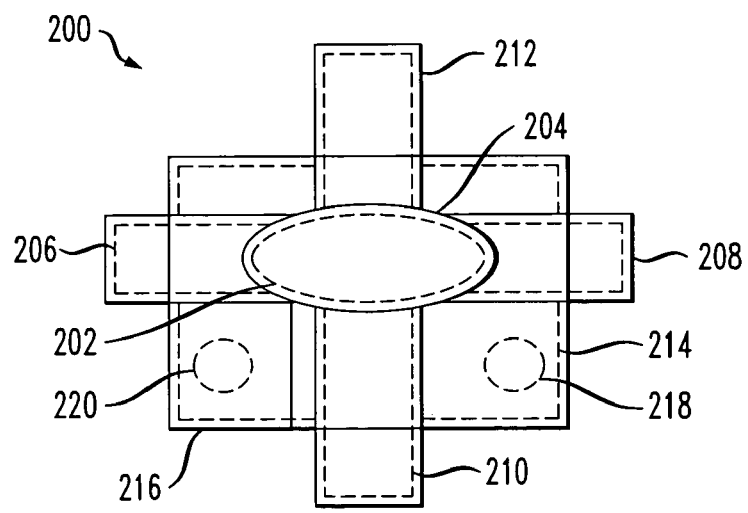
FIG. 3 is a top plan view illustrating the exemplary 2T2MTJ memory cell shown in FIG. 2, in accordance with the present invention.

FIG. 3 illustrates a top plan view of the exemplary 2T2MTJ device depicted in FIGS. 2A and 2B. As previously explained in connection with FIGS. 2A and 2B, the exemplary memory cell 200 includes first and second MTJ devices 202 and 204, respectively. MTJ devices 202 and 204 are connected to first and second local interconnects 214 and 216, respectively. First and second conductive vias 218 and 220 are used to electrically connect the first and second MTJ devices 202 and 204, respectively, to corresponding transistors (not shown) which are preferably formed in a silicon region of the semiconductor wafer, below the MTJ devices. The memory cell 200 is also shown with first and second bit lines 210, 212 and first and second write word lines 206, 208 passing through the cell. As apparent from the figure, the bit lines and write word lines are preferably formed orthogonal relative to one another, although alternative orientations are similarly contemplated by the invention.

By way of example only, in an illustrative integrated circuit layout using, for example, a conventional 0.18 micron CMOS technology, an MRAM using the 2T2MTJ memory cell architecture of the present invention was shown to achieve a thirty-eight percent (38%) increase in memory density compared to standard memory cell architectures, using substantially identical design rules and MTJ device design. As previously stated, further beneficial increases in memory cell density may be achieved by stacking additional MTJ devices (e.g., 3T3MTJ memory cell), in accordance with the techniques of the present invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory cell for use in a magnetic random access memory (MRAM) circuit, the memory cell comprising:
a first transistor formed in a semiconductor layer, the first transistor comprising first and second source/drain regions and a gate;
at least a second transistor formed in the semiconductor layer, the second transistor comprising first and second source/drain regions and a gate;
a first insulating layer formed on at least a portion of the first and second transistors;
a first magnetic storage element formed on the first insulating layer, the first magnetic storage element being electrically connected to the first transistor;
at least a second insulating layer formed on at least a portion of the first magnetic storage element; and
at least a second magnetic storage element formed on the second insulating layer, the second magnetic storage element being electrically connected to the second transistor.

2. The memory cell of claim 1, wherein:
the first magnetic storage element comprises first and second terminals, the first terminal of the first magnetic storage element being electrically connected to a first bit line and the second terminal of the first magnetic storage element being electrically connected to the first source/drain region of the first transistor;
the second magnetic storage element comprises first and second terminals, the first terminal of the second magnetic storage element being electrically connected to a second bit line and the second terminal of the second magnetic storage element being electrically connected to the first source/drain region of the second transistor; and
the second source/drain regions of the first and second transistors are electrically connected together.

3. The memory cell of claim 1, wherein at least one of the first and second magnetic storage elements comprises a magnetic tunnel junction (MTJ) device.

4. The memory cell of claim 1, wherein at least one of the first and second insulating layers comprises an oxide.

5. The memory cell of claim 1, wherein the first and second magnetic storage elements are substantially aligned along a vertical dimension relative to one another.

6. The memory cell of claim 1, wherein the first and second magnetic storage elements are substantially non-overlapping relative to one another.

7. The memory cell of claim 1, further comprising:
a first conductive via electrically connecting the first magnetic storage element to the first transistor; and
at least a second conductive via electrically connecting the second magnetic storage element to the second transistor.

8. The memory cell of claim 7, further comprising a first interconnect and at least a second interconnect, a first end of the first interconnect being connected to the first magnetic storage element and a second end of the first interconnect being connected to the first conductive via, a first end of the second interconnect being connected to the second magnetic storage element and a second end of the second interconnect being connected to the second conductive via.

9. The memory cell of claim 7, wherein at least one of the first and second conductive vias comprises a metal.

10. The memory cell of claim 1, wherein the memory cell is configured such that a first write word line is formed on the first insulating layer and in close relative proximity to the first magnetic storage element, and at least a second write word line is formed on the second insulating layer and in close relative proximity to the second magnetic storage element.

11. The memory cell of claim 1, wherein the memory cell is configured such that first and second read word lines are coupled to the gates of the first and second transistors, respectively, for selectively accessing the first and second magnetic storage elements, respectively.

12. The memory cell of claim 1, wherein the memory cell is configured such that a bit line coupled to the memory cell is shared between the first and second magnetic storage elements associated with the memory cell.

13. The memory cell of claim 1, wherein the memory cell is configured such that a first write word line coupled to the memory cell is shared between the first and second magnetic storage elements associated with the memory cell.

14. A magnetic random access memory (MRAM) array, comprising:
a plurality of memory cells, at least one of the memory cells comprising:
a first transistor formed in a semiconductor layer, the first transistor comprising first and second source/drain regions and a gate;
at least a second transistor formed in the semiconductor layer, the second transistor comprising first and second source/drain regions and a gate;
a first insulating layer formed on at least a portion of the first and second transistors;
a first magnetic storage element formed on at least a portion of the first insulating layer, the first magnetic storage element being electrically connected to the first transistor;
at least a second insulating layer formed on at least a portion of the first magnetic storage element; and
at least a second magnetic storage element formed on at least a portion of the second insulating layer, the second magnetic storage element being electrically connected to the second transistor; and
a plurality of bit lines and word lines operatively coupled to the memory cells for selectively reading and writing one or more memory cells in the MRAM array.

15. The MRAM array of claim 14, wherein:
the first magnetic storage element in the at least one memory cell comprises first and second terminals, the first terminal of the first magnetic storage element being electrically connected to a first bit line and the second terminal of the first magnetic storage element being electrically connected to the first source/drain region of the first transistor;
the second magnetic storage element in the at least one memory cell comprises first and second terminals, the first terminal of the second magnetic storage element being electrically connected to a second bit line and the second terminal of the second magnetic storage element being electrically connected to the first source/drain region of the second transistor; and
the second source/drain regions of the first and second transistors are electrically connected together.

16. The MRAM array of claim 14, wherein at least one of the first and second magnetic storage elements in the at least one memory cell comprises a magnetic tunnel junction (MTJ) device.

17. The MRAM array of claim 14, wherein the at least one memory cell further comprises a first conductive via electrically connecting the first magnetic storage element to the first transistor, and at least a second conductive via electrically connecting the second magnetic storage element to the second transistor.

18. The MRAM array of claim 14, wherein the at least one memory cell is configured such that a first write word line is formed on the first insulating layer and in close relative proximity to the first magnetic storage element, and at least a second write word line is formed on the second insulating layer and in close relative proximity to the second magnetic storage element.

19. The MRAM array of claim 14, wherein the at least one memory cell is configured such that a bit line coupled to the memory cell is shared between the first and second magnetic storage elements associated with the memory cell.

20. The MRAM array of claim 14, wherein the at least one memory cell is configured such that a first write line coupled to the memory cell is shared between the first and second magnetic storage elements associated with the memory cell.

21. The MRAM array of claim 14, wherein the first and second magnetic storage elements associated with the at least one memory cell are substantially aligned along a vertical dimension relative to one another.

22. The MRAM array of claim 14, wherein the first and second magnetic storage elements associated with the at least one memory cell are substantially non-overlapping relative to one another.

23. An integrated circuit device including at least one memory cell, the at least one memory cell comprising:
first and second transistors formed in a semiconductor layer;
a first insulating layer formed on at least a portion of the first and second transistors;
a first magnetic storage element formed on at least a portion of the first insulating layer, the first magnetic storage element being electrically connected to the first transistor;
at least a second insulating layer formed on at least a portion of the first magnetic storage element; and
at least a second magnetic storage element formed on at least a portion of the second insulating layer, the second magnetic storage element being electrically connected to the second transistor.

* * * * *